United States Patent
Kantor

(10) Patent No.: US 10,115,075 B1
(45) Date of Patent: Oct. 30, 2018

(54) RADIO FREQUENCY IDENTIFICATION (RFID) INVENTORY MANAGEMENT SYSTEM

(71) Applicant: Amazon Technologies, Inc., Seattle, WA (US)

(72) Inventor: Oleg Kantor, Kirkland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 102 days.

(21) Appl. No.: 15/274,992

(22) Filed: Sep. 23, 2016

(51) Int. Cl.
*G06Q 10/08* (2012.01)
*G06K 19/077* (2006.01)
*G01R 29/10* (2006.01)

(52) U.S. Cl.
CPC ... *G06Q 10/0875* (2013.01); *G06K 19/07775* (2013.01); *G06K 19/07786* (2013.01); *G01R 29/10* (2013.01)

(58) Field of Classification Search
CPC .. G06K 19/07786; H01Q 1/2208; H01Q 9/16; H01Q 9/26; H01Q 13/206; H01Q 1/2216; H01Q 13/106; H01Q 9/0407; G01R 29/10; H04B 7/0608
See application file for complete search history.

(56) References Cited

U.S. PATENT DOCUMENTS

| | | | | |
|---|---|---|---|---|
| 2007/0279231 A1* | 12/2007 | Cheng | ............ | G06K 19/07786 340/572.7 |
| 2011/0140977 A1* | 6/2011 | Yang | ............ | H01Q 1/2216 343/725 |
| 2012/0013469 A1* | 1/2012 | Kai | ............ | G06K 19/0779 340/572.7 |
| 2014/0008446 A1* | 1/2014 | Carr | ............ | H01Q 1/248 235/492 |
| 2014/0152507 A1* | 6/2014 | McAllister | ......... | G06K 7/10376 342/126 |
| 2015/0116153 A1* | 4/2015 | Chen | ............ | H01Q 5/22 342/359 |
| 2015/0200461 A1* | 7/2015 | Matsumura | .......... | H01Q 9/0407 343/843 |

OTHER PUBLICATIONS

ARC Technologies, Inc. Technical Data Sheet LS-10055, Revision D, May 2016.
Harting "Ha-VIS LOCFIELD Flexible, small UHF RFID Antenna." (document created Jan. 29, 2015).

(Continued)

*Primary Examiner* — Mirza Alam
(74) *Attorney, Agent, or Firm* — Knobbe, Martens, Olson & Bear, LLP

(57) ABSTRACT

Disclosed embodiments relate to a rapid inventory management system that comprises an RFID reader, an antenna with an antenna shape, a high-conductive material, and RFID tags attached to items. In some embodiments, an inventory management system tracks inventory by interrogating RFID tags with an RF wave of a wavelength generating an RFID field and receiving data from the RFID tags that include information on the item. The high-conductive material may disposed at a distance of a quarter wavelength from the antenna. The antenna may comprise a particular shape of bends and arms, the arms at a distance of a quarter wavelength from each other.

19 Claims, 13 Drawing Sheets

(56) References Cited

OTHER PUBLICATIONS

Harting RFID Product Note, "Design your own UHF RFID reading zone Ha-VIS LOCFIELD RFID antenna," dated Mar. 14, 2014 in 2 pages.
Harting, "LocField Reader Antenna Promises Flexible Read Range." RFID Journal, Aug. 8, 2016, 2 pages.
Amazon Robotics, https://en.wikipedia.org/wiki/Amazon_Robotics (last modified Sep. 21, 2016).
A Day in the Life of a Kiva Robot, https://www.youtube.com/watch?v=6KRjuuEVEZs (Published on May 11, 2011).
Tour of Amazon Kiva Robots in Warehouse/Fulfillment center, https://www.youtube.com/watch?v=8of0t_tpWI0 (Published on May 16, 2015).
Swedberg "Harting's LocField Reader Antenna Promises Flexible Read Range," RFID Journal, Jun. 24, 2014.

\* cited by examiner

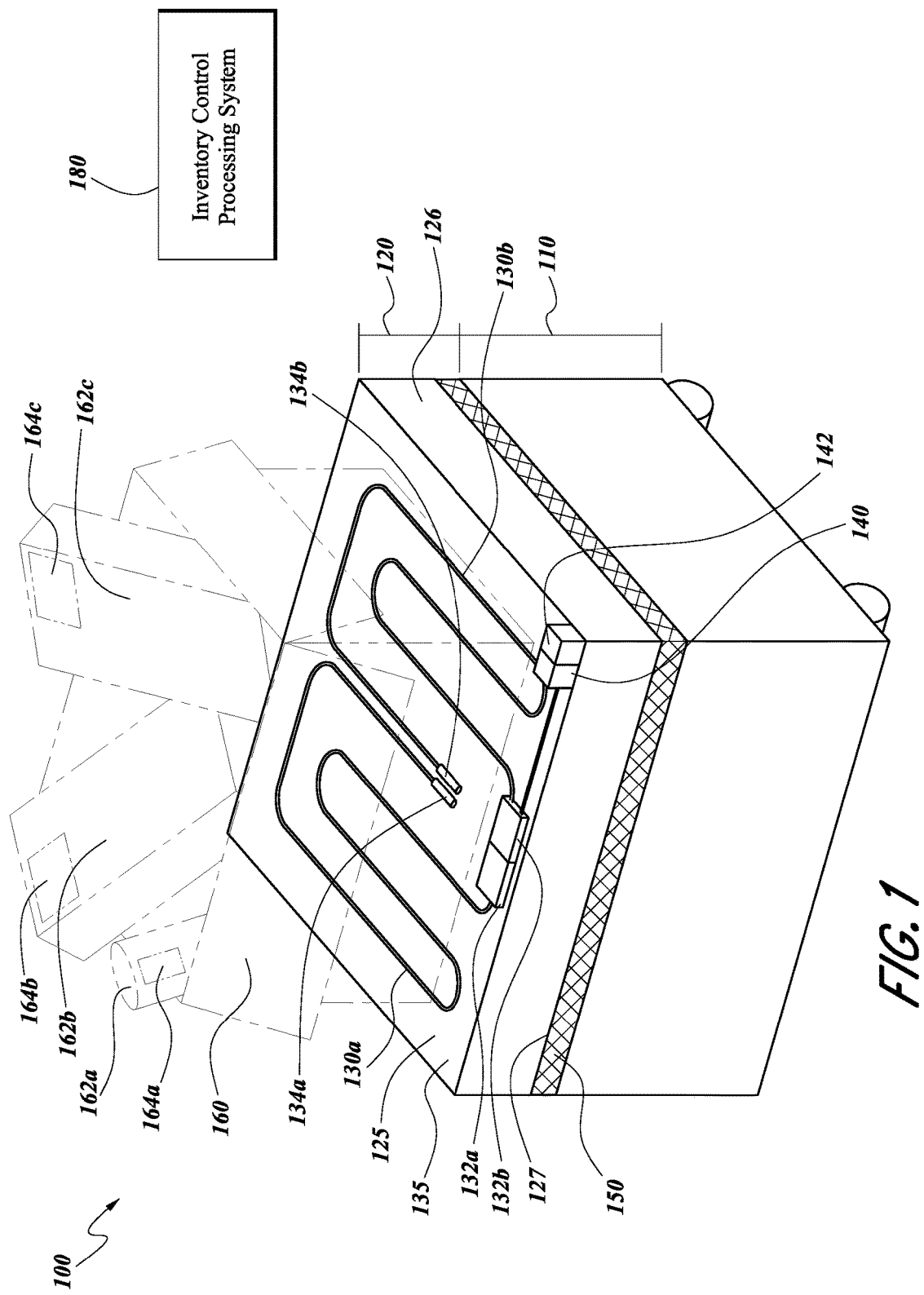

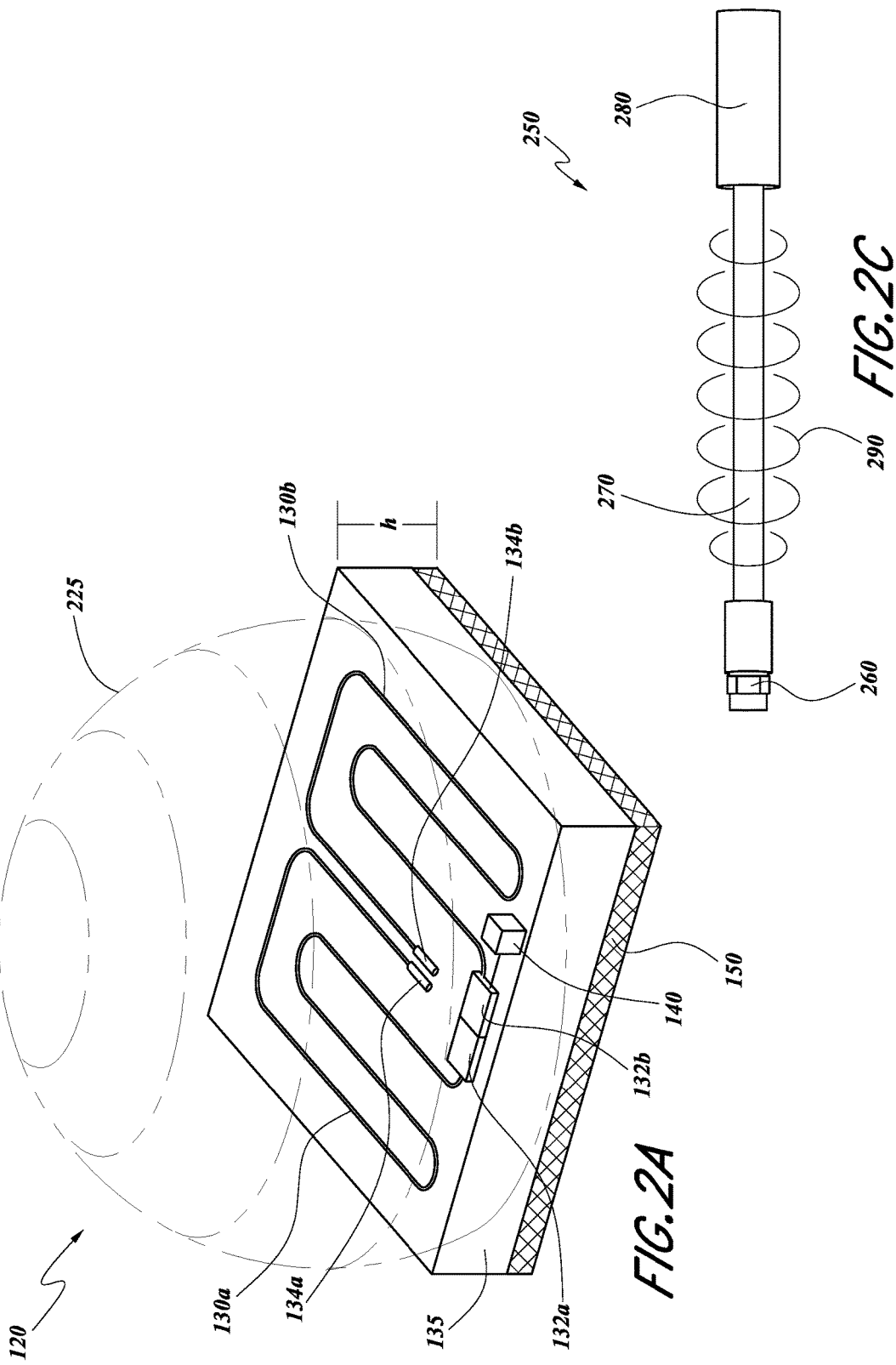

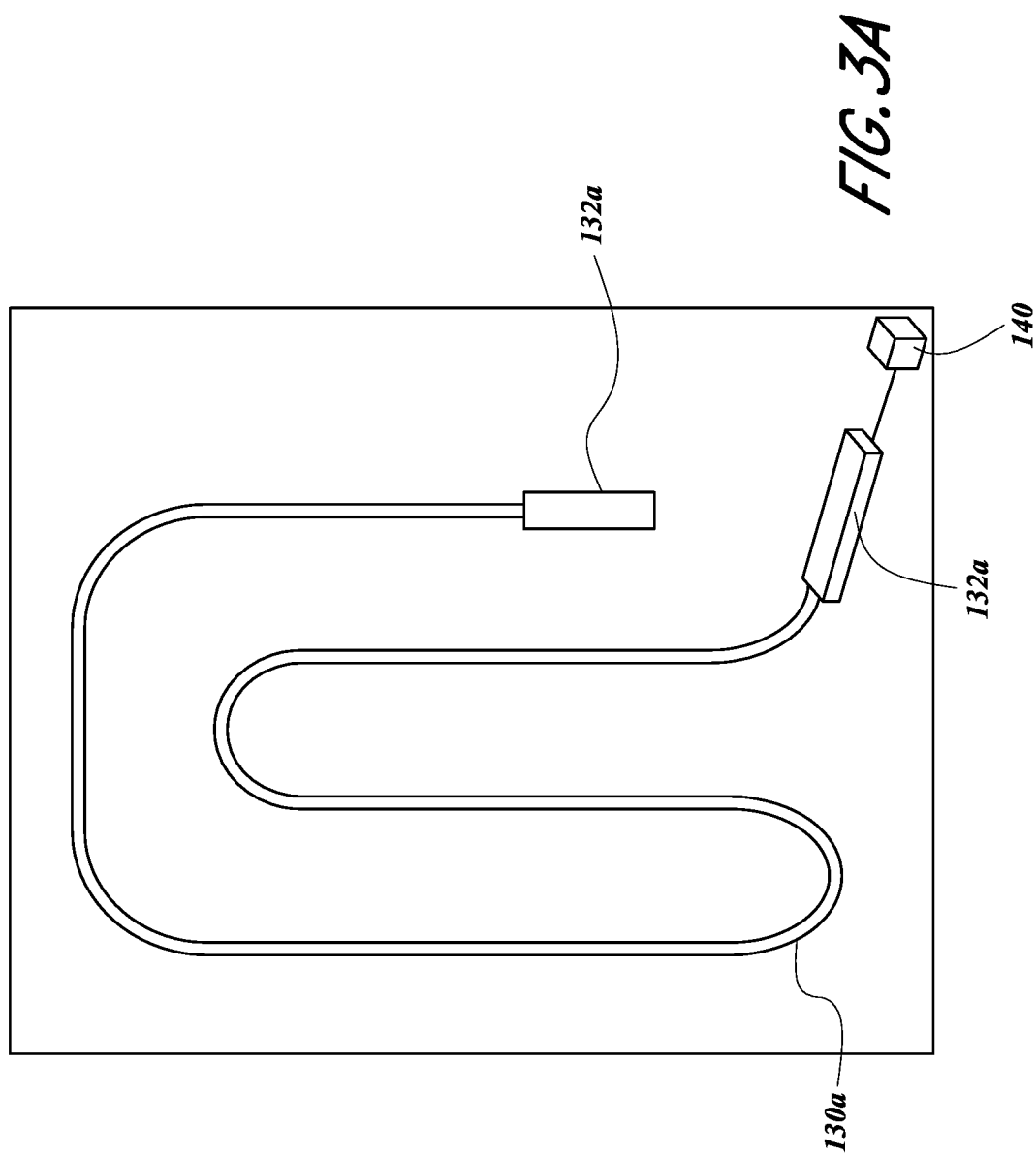

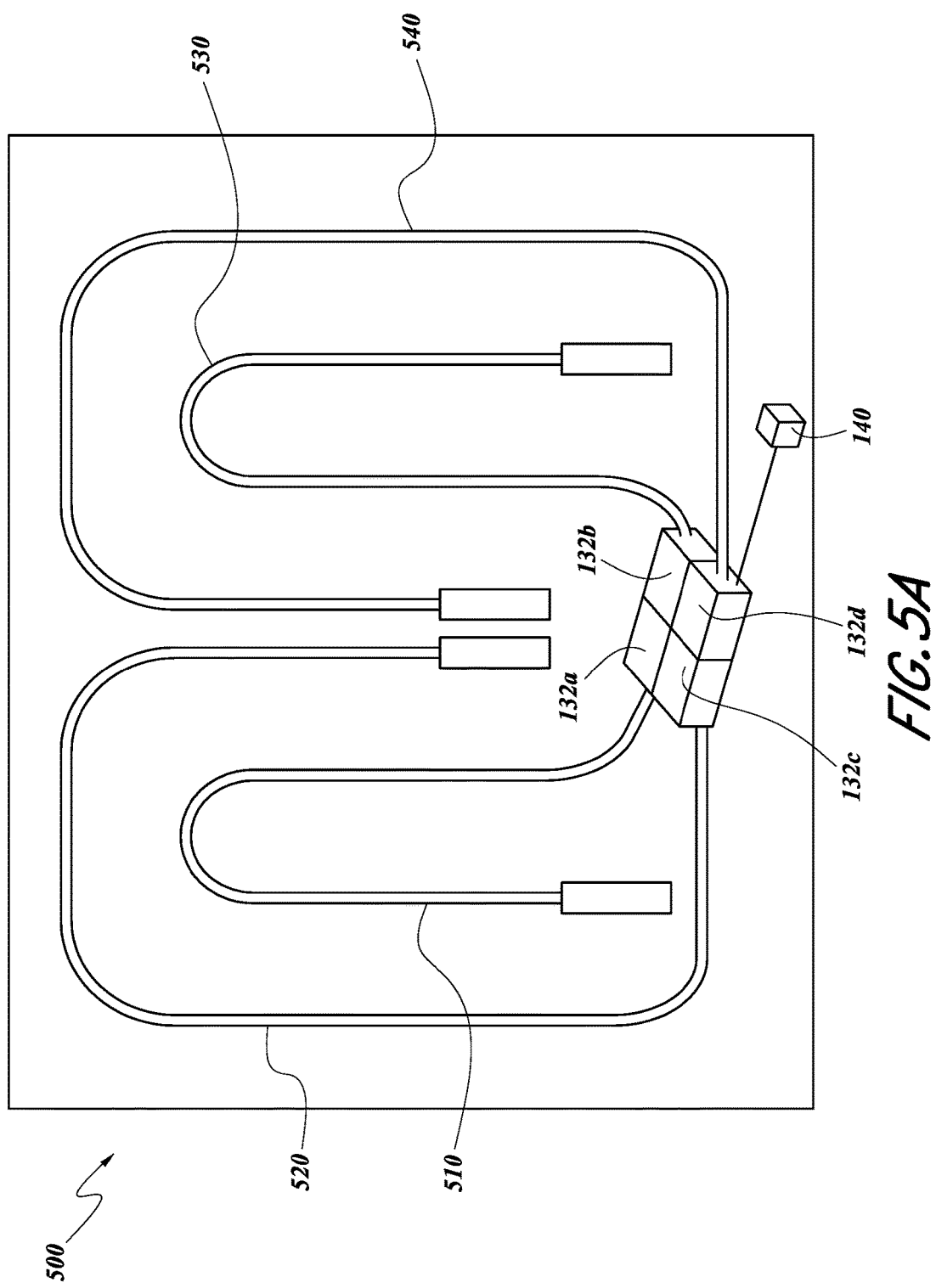

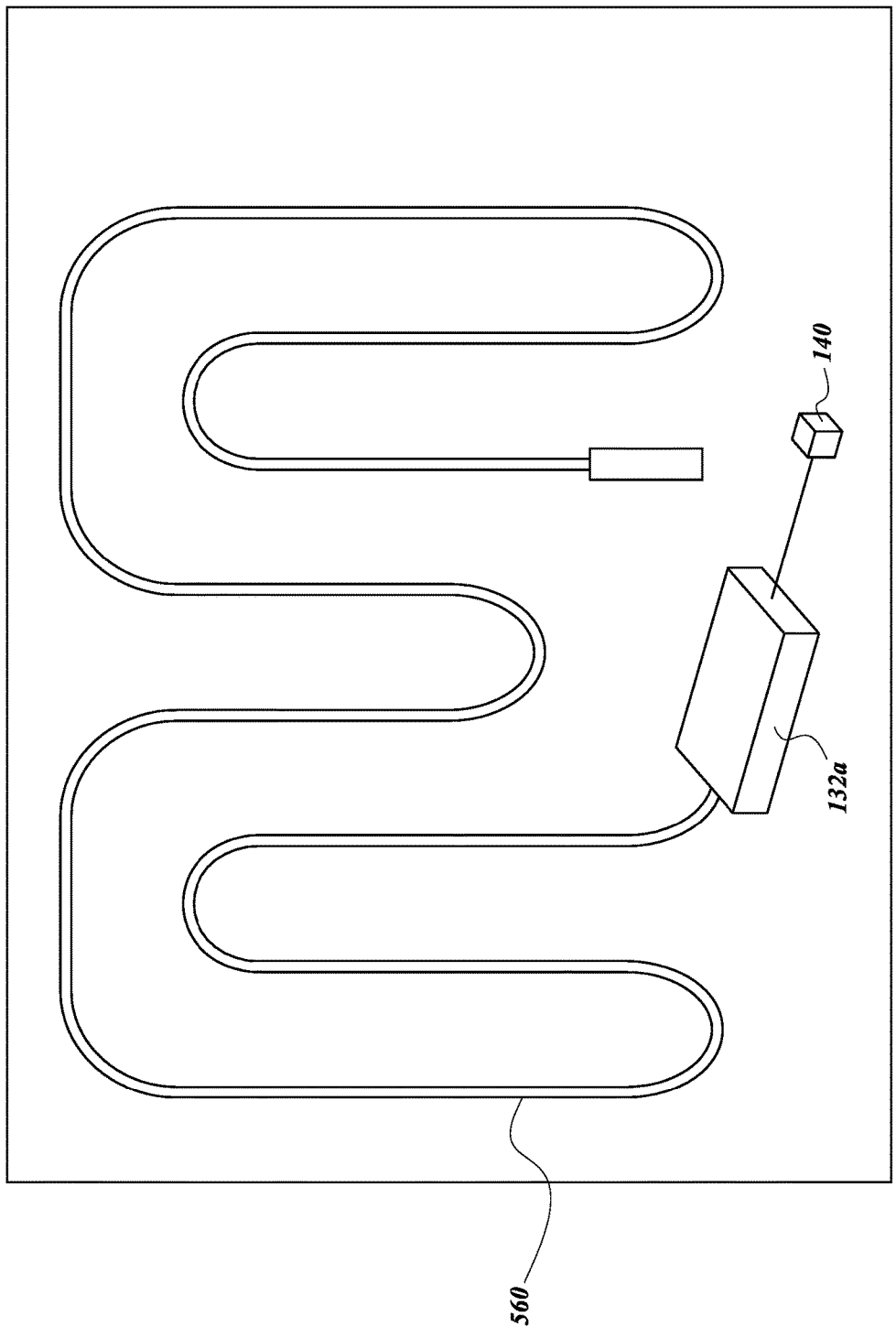

RADIO FREQUENCY IDENTIFICATION (RFID) INVENTORY MANAGEMENT SYSTEM

BACKGROUND

Electronic commerce has become increasingly popular with consumers as the accessibility and ease of placing orders electronically or via the Internet continues to improve. At the same time, network-based retailers have continued to expand the availability of products and items available for purchase, lease, or other type of acquisition, electronically or via the Internet to thousands, or even millions, of items. As a result, consumers may choose from an unprecedented variety of items without leaving the home. In order to offer this wide selection of items, some retailers maintain numerous strategically placed fulfillment centers or other physical storage facilities that store items. After a consumer has placed an order for an item electronically or via the Internet, an order is received at the storage facility, and the item is shipped from the storage facility to the consumer.

One way retailers may differentiate their service from others is the delivery model. For example, some retailers may provide high accuracy in their orders and speed in delivery. Error can be introduced when humans or deficient technology perform inventory management. For example, items are miscounted, or incorrectly shipped or stored. This may lead to frustrated consumers, expense on shipping and storage, and delays in an order. Furthermore, a quicker method of inventory management is desired to encourage faster delivery from the fulfillment center to the consumer or business.

BRIEF DESCRIPTION OF DRAWINGS

FIG. 2A illustrates an example of the RFID interrogation unit of FIG. 1 in further detail.

FIG. 2C illustrates an example of an antenna cable of FIGS. 1 and 2A-2B in further detail.

FIG. 3A illustrates an example of an antenna shape of the inventory management system using a single antenna.

FIG. 3B-1 illustrates an example of a polar plot and planar plot of the RF field generated by an antenna having the shape shown in FIG. 3A. The polar plot is a cross section in the XZ plane, where Z is vertical and X is horizontal.

FIG. 3B-2 illustrates an example of a polar plot and planar plot of the RF field in the YZ plane, where Y is rotated 90 degrees about the vertical Z axis compared to the plots in FIG. 3B-1.

FIG. 5A illustrates an example of an antenna shape of the inventory management system including four antennas.

FIG. 5C illustrates an example of an antenna shape of the inventory management system including a single antenna with several bends.

Figure 2B:
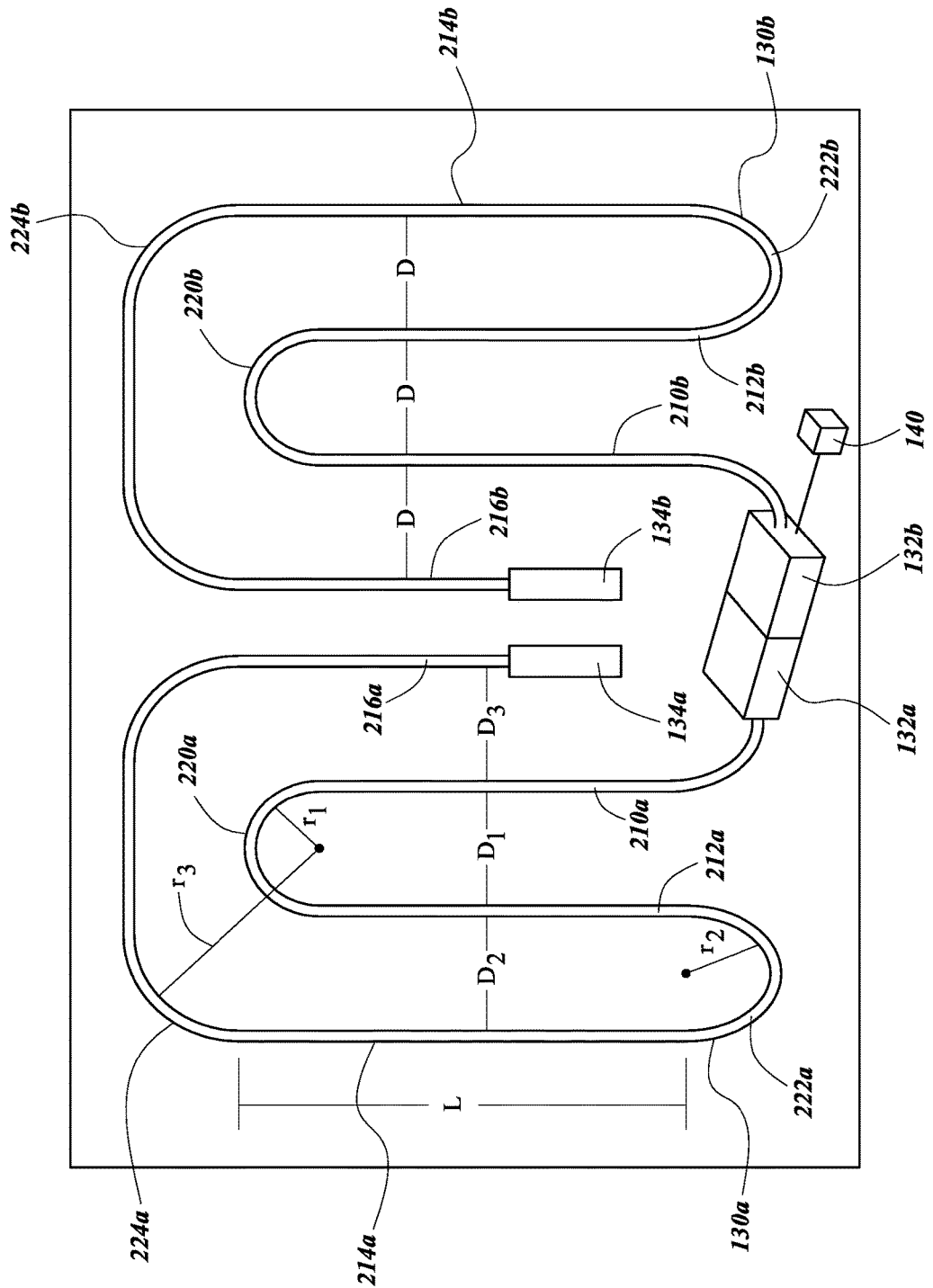
FIG. 2B illustrates an example of an antenna shape of FIGS. 1 and 2A in further detail.

These and other features will now be described with reference to the drawings summarized above. Throughout the drawings, reference numbers may be re-used to indicate correspondence between referenced elements. The drawings are provided to illustrate example embodiments described herein and are not intended to limit the scope of the disclosure. Note that the relative dimensions of the following figures may not be drawn to scale.

DETAILED DESCRIPTION

Overview

Generally described herein, some aspects of the present disclosure relate to an inventory management system that uses a radio frequency (RF) identification (RFID) reader, a specially-shaped antenna, and a high-conductive material configured to generate a specially-shaped RF radiation shape, and RFID tags attached to items to provide a quicker and more accurate system to perform inventory management. For example, the inventory management system tracks inventory by interrogating RFID tags within the RF radiation pattern and receives data from the RFID tags that include information about the items.

Items with RFID tags may be placed in a bin and the bin placed on the inventory management system. The inventory management system can generate an RF electromagnetic field to interrogate the RFID tags. The inventory management system includes an antenna with a particular antenna shape to generate the RF interrogation field. For example, the antenna includes bends and associated arms, with the arms at certain distances from each other, for example, one-quarter of the wavelength of the RF field.

The antenna can be disposed at a distance from an electrically conductive material, for example, one-quarter of the wavelength of the RF field below the antenna. The inventory management system can use the antenna shape and electrically conductive material to generate the localized RF electromagnetic field. The electromagnetic field can interrogate the RFID tags in the bin while reducing unwanted read effects, such as activating RFID tags of nearby bins. The antenna may also be scalable to adapt the radiation pattern to work with any sized bin.

The RFID tags are typically passive (without an internal power source such as a battery) and can absorb energy from the electromagnetic field and generate a backscatter signal back to the antenna. Thus, the RFID tags can transmit data back to the inventory management system. The inventory management system can receive and process the data to determine characteristics of the items, such as identifying the types and number of items in the bin. In some embodiments, the inventory management system performs operations based on the data provided, such as sending an update accounting for a particular item or creating a summary report for all items in a bin.

The inventory management system may also include an RFID reader connected to one or more antennae. The RFID reader can provide power to and receive data from the antenna.

The features described herein address a variety of problems in fulfillment centers. In some embodiments, the inventory management system may reduce the expense for the fulfillment center, or other inventory management department. For example, companies can save time and money by implementing quick and accurate identification of items in a bin. In one example, the read rate was about 98% for a bin placed on an inventory management system for less than 10 seconds.

The inventory management system may reduce the period of time required to perform such tasks using RFID technology. Taking a shorter amount of time may also reduce delays in disseminating information to other groups, and thus promote timely inventory reports and data. Time previously spent on monitoring can also be used instead on more productive activities for the business. In some embodiments, the inventory management system may be performed automatically on a conveyor belt to further automate the process, further reducing the amount of monitoring required to ensure that each transaction is accounted for and that the products are stocked appropriately for current and predicted future orders.

The inventory management system can reduce human error. For instance, the inventory management system mitigates the chance of people forgetting to record a transaction, miscounting of the number of goods, and entering incorrect information into the system. This lessens the number of erroneous additional orders, unnecessary shipping costs, the amount of storage necessary to account for incorrect orders and inventory stocking, and the chance of running out of inventory.

Example Inventory Management System for Identifying Items within a Bin

Figure 1:
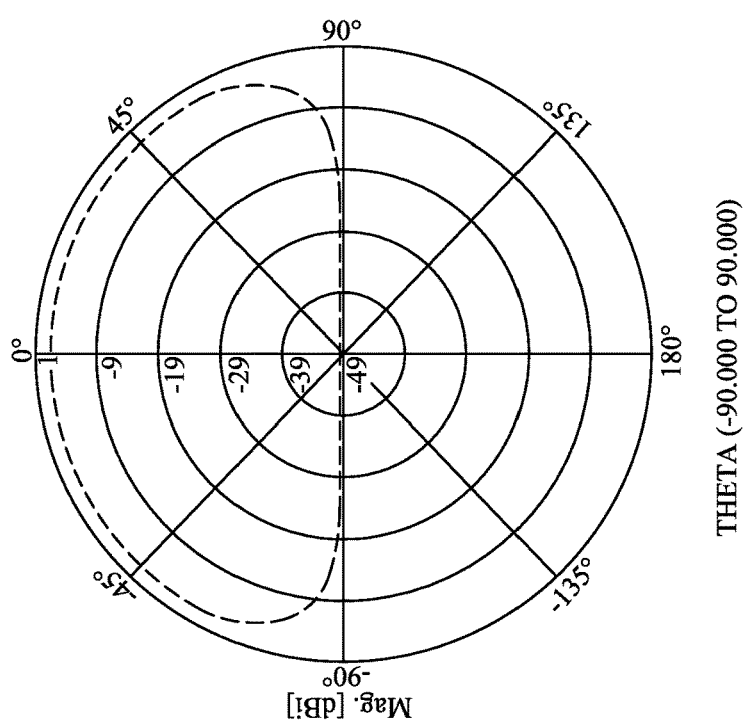
FIG. 1 illustrates an example of an inventory management system for identifying items within a bin.
Figure 3B:
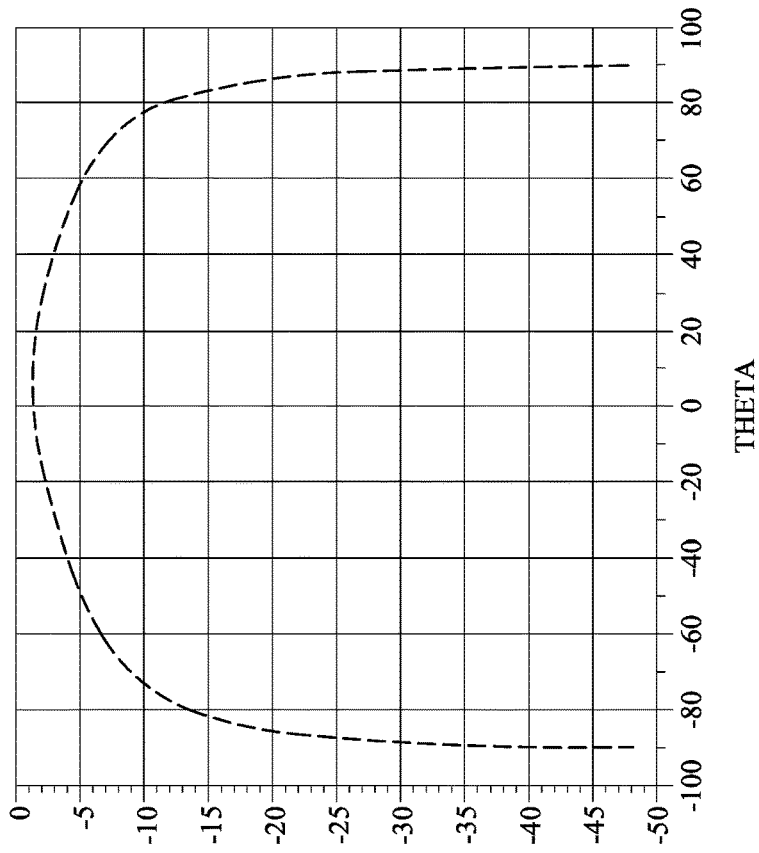

FIG. 1 illustrates an example of an inventory management system 100 for identifying items within a bin.

The inventory management system 100 may include a cart 110 and an RFID interrogation unit 120 as shown in FIG. 1. A bin 160 containing items 162a, 162b, 162c that are tagged with RFID tags 164a, 164b, 164c can be placed onto the RFID interrogation unit 120, which can generate an RF electromagnetic field that interrogates the RFID tags 164a, 164b, 164c to determine data about the content of the bin 160.

The cart 110 permits the RFID interrogation unit 120 to be moved to different locations in a warehouse or item fulfillment center. The cart 110 in the example of FIG. 1 is a cart with wheels. The cart 110 can be hand propelled, motorized with control, or may move automatically. In other embodiments, the cart 110 is an integral part of the RFID interrogation unit 120 or it may be placed on the cart 110. The cart may be sized so that warehouse or inventory bins can be placed on top of the RFID interrogation unit 120 of the cart. In some embodiments, the RFID interrogation unit 120 may disposed below or above a conveyor belt and the bin 160 is disposed onto the conveyor belt, and the conveyor belt moves the bin 160 over the RFID interrogation unit 120. In yet other embodiments, the RFID unit 120 is portable (without the cart 110) and can be moved to a location where inventory bins are to be interrogated. The bin 160 may also be different types, shapes.

The RFID tags may be passive RFID tags that receive power from the RFID field and transmit data to the antennae 130a, 130b. However, the RFID interrogation unit 120 may receive data from active RFID tags.

The RFID interrogation unit 120 can be used to generate an RF electromagnetic field that interrogates and receives data from RFID tags 164a, 164b, 164c attached to items in the bin 160. For example, the RFID interrogation unit 120 comprises two antennae 130a, 130b. In FIG. 1, each of the two antennae 130a, 130b can have a particular antenna shape. The two antenna shape can have similar characteristics, as illustrated in FIG. 1. In some examples, the radio frequency ("RF") field travels along the length of the antennae 130a, 130b, across ferrite cores 132a, 132b, and towards a terminal end 134a, 134b. The ferrite cores 132a, 132b can be attached to the antennae 130a, 130b to absorb the RF energy. The antennae 130a, 130b may be placed on a low-conductive (e.g., non-conductive) material 135 to reduce interference with the electromagnetic field.

In some embodiments, an RF energy absorbing material may be disposed near, around, and/or over at least part of the ferrite core 132a, 132b. One example of an RF energy absorbing material is a dielectric such as graphite foam. For example, LS-10055 graphite foam from ARC Technologies, Inc. (Amesbury, Mass.) was used for some implementations of the RFID interrogation unit operating at RF frequencies near 1 GHz. However, other materials may be used (e.g., for 10.5 MHz, a magnetic material may be used). The RF energy absorbing material may provide an insertion loss in a range from, e.g., −2 dB to −10 dB.

The RFID interrogation unit 120 may comprise a top surface 125 on which the antennas 130a and 130b are disposed and a bottom surface 127. The top surface 125 and the bottom surface 127 can be connected by sides 126. The top surface 125 may be formed from a low-conductive material such as a dielectric. For example, the top surface 125 can be formed from wood, plastic, cardboard, etc. The bottom surface 127 may comprise a high-conductive material such as a metal. The sides 126 can comprise low-conductive material such as a dielectric. In some implementations, at least a portion of the sides 126 extending from the bottom surface 127 may comprise a high-conductive material (e.g., a metal), which may improve RFID received signal strength.

The inventory management system 100 includes an RFID reader 140. The RFID reader 140 may receive power from a power supply 142. The power supply 142 may be a rechargeable power supply, a remote power supply, or other power supply that can supply power to the RFID reader 140. The RFID reader 140 can send an RF traveling wave to the antennae 130a, 130b in order to generate an RF interrogation field to read the RF tags 164a, 164b, 164c in the bin 160. The return RF signal from the RFID tags 164a, 164b, 164c can be received by the antennae 130a, 130b and communicated to the RFID reader 140, which can communicate data about the interrogated RFID tags 164a, 164b, 164c to an inventory control processing system 100. The RFID reader 140 can be connected to other components of the RFID interrogation unit 120 through wired, wireless, and/or network technology. The RFID reader 140 can be located inside or outside the RFID interrogation unit 120. The inventory control processing system 100 can be connected, wired or wirelessly, to the inventory management system 100, and can be programmed to process the data received from the RFID tags 164a, 164b, 164c, e.g., to count the number of items 162a, 162b, 162c in the bin 160, identify the items 162a, 162b, 162c in the bin 160, and so forth. Further filtering or signal conditioning can be used to better distinguish between data from RFID tags 164a, 164b, 164c and unwanted signals. In some implementations, the inventory control processing system 100 is included in the RFID interrogation unit 120 or the cart 110.

As shown in FIG. 1, a high-conductive material 150 may also be included in the RFID interrogation unit 120. The high-conductive material 150 can be used to reflect the RFID field generated by the antennae 130a, 130b. In some embodiments, the high-conductive material 150 is disposed at a distance from the antenna 130a, 130b. For example, the high-conductive material 150 is disposed at a quarter wavelength from the antennae 130a, 130b.

Example Antenna Shape for RFID Interrogation Unit

FIG. 2A illustrates an example of the RFID interrogation unit of FIG. 1 in further detail. In this example, the RFID interrogation unit 120 comprises two antennae 130a, 130b an RFID reader 140, a low-conductive material 135, and a high-conductive material 150. FIG. 2A also schematically shows an example of the RF interrogation field 225 generated by the antennae 130a, 130b. The RF interrogation field 225 is generally spherically symmetric and includes electromagnetic fields having significant power in both linear and circular polarization so as to interrogate RFID tags positioned in any orientation within the bin. FIGS. 3B-1, 3B-2, and 3C, described below, show additional details for an example of the RF field 225.

FIG. 2B illustrates an example of an antenna shape of FIGS. 1 and 2A in further detail. This antenna shape generates an electromagnetic field over the top of the RFID interrogation unit 120. The antenna shape of FIG. 2B for the antenna 130a will be described. In this example, the antenna 130a is connected to and can electrically communicate with the RFID reader 140. The antenna 130a comprises a plurality of arms and bends. The antenna 130a includes a first ferrite core 132a, and a first arm 210a that is connected to an end of a first bend 220a. A second arm 212a is connected to the other end of the first bend 220a and to an end of a second bend 222a. A third arm 214a is connected to the other end of the second bend 222a and to one end of a third bend 224a. A fourth arm 216a is connected to the other end of the third bend 224a and the antenna 130a terminates at the terminal end 134a. The RFID reader 140 is connected to the first arm 210a.

The first arm 210a, second arm 212a, third arm 214a, and fourth arm 216a each have a length L1, L2, L3, and L4, respectively. In FIG. 2B, the lengths of arms 210a, 212a, 214a, and 216a are substantially the same. However, each of the arms can have different shapes, sizes, and configurations.

In some embodiments, one or more arms 210a, 212a, 214a, and 216a may not be straight. For example, any of the arms can be curved or have the shape of a sinusoidal wave. The term "substantially" includes configurations that generate a radiation pattern over the surface of the RFID interrogation unit 120 (e.g. 1-2%, 5-10%, 10-20% variability). In many implementations, the arms are substantially straight such that the arms do not extend laterally away from a straight line connecting the ends of the arm by more than 5%, 10%, or 20% of the length of the arm. The lateral displacement of substantially straight arms may also be a fraction of the distance, d, between adjacent arms, where the fraction may be less than 20%, less than 10%, or less than 5%.

In some implementations, each arm 210a, 212a, 214a, and 216a includes a plurality of different shapes. For example, an arm 210a can have a substantially straight portion, a sinusoidal portion, and a curved portion. For arms 210a, 212a, 214a, and 216a with different shapes and/or configurations, several methods can be implemented to measure the distance between the arms 210a, 212a, 214a, and 216a. For example, the distance can be measured from the center point on the arm 210a, 212a, 214a, and 216a. The distance can also be measured from an average of the distance across each point on the arm 210a, 212a, 214a, and 216a. The distance can be measured from the closest or the farthest point to another arm 210a, 212a, 214a, and 216a.

The example in FIG. 2B shows arms 210a, 212a, 214a, and 216a that are substantially parallel. However, the arms 210a, 212a, 214a, and 216a can be angled related to another arm such that the arms 210a, 212a, 214a, and 216a are not parallel with one another and form angles with each other, such as less than 20 degrees, less than 10 degrees, or less than 5 degrees.

In this example, the first arm 210a can be disposed at a distance D1 from the second arm 212a, the second arm 212a disposed at a distance D2 from the third arm 214a, and the first arm 210a disposed at a distance D3 from the fourth arm 216a. In FIG. 2B, the distances D1, D2, and D3 are the same or substantially the same. However, distances can be different.

One, some, or all of the distances d1, d2, d3 may be substantially a quarter wavelength. The wavelength ($\lambda$) is associated with the frequency (f) of the emitted RF electromagnetic field and the speed of light (c): lambda=c/f. For example, if the transmitted frequency is 915 MHz, then the distance between the arms 210a, 212a, 214a, and 216a can be about 80 mm. However, different distances between the arms can be included in the RFID interrogation unit 120. For example, a set of two arms 210a, 212a may be closer together than another set of two arms 212a, 214a (distance D1 is less than the distance D2).

The bends 220a, 222a, and 224a may be in the shape of a semi-circle with a radius R1, R2, and R3 respectively. As illustrated in FIG. 2B, the radiuses R1 and R2 can be the same or substantially the same. However, different radiuses can be used for the bends in the RFID interrogation unit 120. For example, one or more radiuses may be greater than another (e.g. radius R1 greater than radius R2).

Different shaped bends 220a, 222a, and 224a can be used. In some implementations, one or more bends 220a, 222a, and 224a can contain one or more corners and/or oval shapes. For differently shaped bends, the radius can be calculated in a variety of different ways. The radius can be determined based on one or more points on the bend 220a, 222a, and 224a. For example, a midpoint of the bend 220a, 222a, and 224a can be used to estimate a radius. In another example, an estimate average radius can be used from each point on the bend 220a, 222a, and 224a, or the closest or farthest point on the bend 220a, 222a, and 224a. Each of the bends 220a, 222a, and 224a may also have a plurality of shapes, such as a single bend including a curved portion, a corner portion, and a straight portion. In some embodiments, the bends 220a, 222a, and 224a can boost read range and/or accuracy.

In the example of FIG. 2B, the first bend 220a, second bend 222a, and third bend 224a each connect to two arms that are substantially parallel. The bends 220a, 222a, and 224a in these embodiments have a substantially 180 degree turn. However, the bends 220a, 222a, and 224a may not be substantially 180 degrees and thus the arms 210a, 212a, 214a, and 216a connected to a bends 220a, 222a, and 224a not parallel, as described above.

In the example of FIG. 2B, the first bend 220a is within the circumference of the third bend 224a (e.g. r3 is greater than r1). It is understood that the bends 220a, 222a, and 224a can bend in other directions. For example, the third bend 224a can bend the other way and the fourth arm 216a can be at a distance D3 from the third arm 214a instead of being disposed at a distance D3 from the first arm 210a. In another example, the second bend 222a can bend the other way and the third arm 214a can be at a distance D2 from the first arm 210a instead of from the second arm 212a.

The antenna 130b of the example in FIG. 2B shows similar characteristics of the antenna 130a. The right antenna 130b is illustrated in FIG. 2B to connect to the RFID reader 140, include a second ferrite core 132b, extend on a first arm 210b, connect to a first bend 220b, extend on a second arm 212b, connect to a second bend 212b, extend on a third arm 214b, connect to a third bend 214b, extend on a fourth arm 216b, and terminate at a terminal end 134b. The different embodiments described above for the left antenna 130a can apply to the right antenna 130b. For example, the different embodiments related to the lengths of the arms, distance between the arms, characteristics of the bends, and other characteristics of the first antenna 130b apply to the right antenna 130b. The right antenna 130b may have different lengths, distances, radiuses, configurations, shapes, and sizes than the left antenna 130a. For example, bend 220a of antenna 130a may have a smaller radius than bend 220b of antenna 130b, the first arm 210b may be longer than the first arm 210a, and the distance between the first arm 210b and the second arm 212b may be greater than the distance between the first arm 210a and the second arm 212a.

The antennae 130a and 130b may have a ferrite core 132a, 132b on each antenna 130a, 130b. In FIG. 2B, the end of the antennae 130a, 130b come in close proximity of one another at the fourth arms 216a, 216b. The example shows that the total length of antennas 130a and 130b are substantially the same. However, the antennas 130a and 130b may be of different lengths. For example, the antenna 130a may be shorter than the antenna 130b, and thus the fourth arm 216a may end shorter than the fourth arm 216b.

The fourth arms 216a, 216b are shown to be substantially proximate to each other in FIG. 2B. However, the fourth arms 216a, 216b can be disposed in different locations and at different distances from each other. For example, the arms can be placed at a distance of a quarter wavelength from one another.

Example High-Conductive Material

In some embodiments, the bottom surface 127 of the RFID interrogation unit 120 includes a high-conductive material 150 and is placed at a height H from the antennas 130a, 130b. For example, the height H can be substantially a quarter wavelength of the RF field generated by unit 120, as described above. For example, if the transmitted frequency is 915 MHz, then the distance can be substantially 80 mm. However, other heights H can be used.

The high-conductive material 150 can include a metal (e.g., aluminum), or combinations of metals. The high-conductive material 150 may also comprise a mix (e.g., layers) of high-conductive materials, low-conductive materials, and/or other materials. Furthermore, the high-conductive material 150 can be formed as a plate or a foil or layers of plates or foils. The conductivity of the high conductive material can be greater than about $10^6$ Siemens/m.

Example Low-Conductive Material

In FIG. 2A, a low-conductive material 135 is disposed near the antennae 130a, 130b, the high-conductive material 150, and the RFID reader 140. The low-conductive material 135 may be disposed further away from the antenna 130a, 130b, the high-conductive material 150, and/or the RFID reader 140. The low-conductive material 135 may house some components of the RFID interrogation unit 120. In one embodiment, the RFID reader 140 is housed within the low-conductive material 135, while the antennae 130a, 130b are placed on top of the low-conductive material 135 and the high-conductive material 150 is disposed below the low-conductive material 135, as shown in FIG. 2A.

Low-conductive materials generally reflect less RF energy than high-conductive materials. The low-conductive material can comprise wood, plastic, cardboard, or other dielectric material(s). The low-conductive material 135 may further comprise a mix of low-conductive material, high-conductive material, and/or other material. A particular thickness of the low-conductive material 135 may be used. For example, plastic may have different dielectric characteristics than cardboard and thus require a different thickness to have similar dielectric properties. The conductivity of the low-conductive material can be less than $10^{-6}$ Siemens/m. In various embodiments, the high-conductivity material has a conductivity greater than the conductivity of the low-conductivity material by a factor greater than $10^6$, $10^8$, $10^{10}$, or more.

Example RFID Reader and Tags

The RFID reader 140 can help provide the connection between the RFID tags 164a, 164b and the inventory management system 100. As described in FIG. 2, the RFID reader 140 can be connected to the antennae 130a, 130b. The RFID reader 140 can transmit power to the antenna 130a, 130b. The antennae 130a, 130b can convert the electrical current into electromagnetic waves which are radiated to the RFID tags 164a, 164b.

Figure 2:
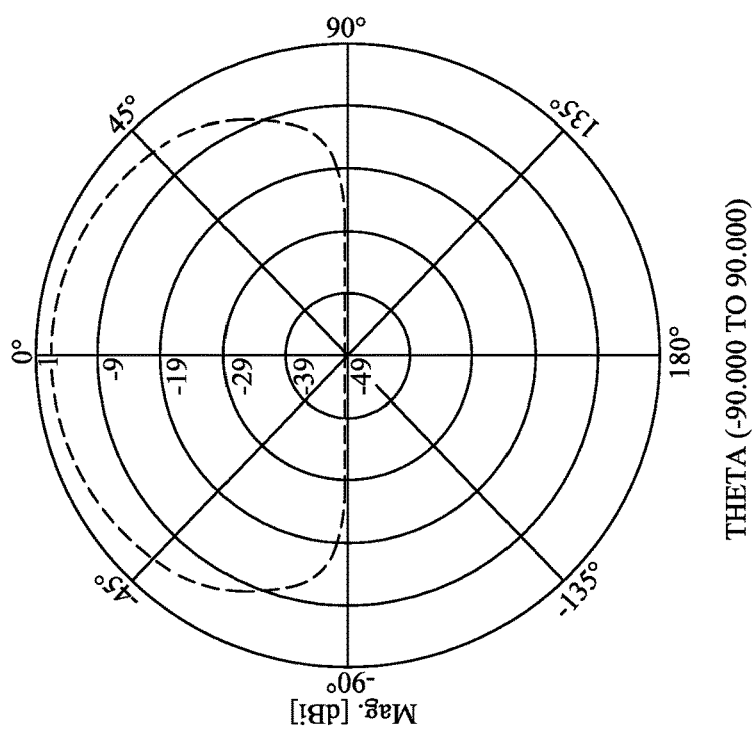

The RFID reader 140 can filter the data, process the data, and transmit the data to a different component or entity, such as a remote device or server. The RFID reader 140 can also transmit data to a different component to filter and/or process the data. The RFID reader 140 itself can perform data processing on the received data. For example, the RFID reader 140 can identify and count the items 162a, 162b located within a bin 160, generate a summary, and update an inventory database. In FIG. 2, the RFID reader 140 is located in the RFID interrogation unit 120. However, the RFID reader 140 can be placed in a different location, such as on a remote device, or on the cart. The RFID reader 140 can also comprise multiple components disposed in different locations. To illustrate, one component may be used to transmit the power to the antenna 130a, 130b. A separate component may be used to receive data from the RFID tags 164a, 164b. A remote processor may comprise a third component that can be used to receive and process the received data.

In some embodiments, the RFID reader 140 determines the power to be generated from the antennae 130a, 130b. The RFID reader 140 may receive power from a power supply 142. The RFID reader 140 may transmit the appropriate power to the antennae 130a, 130b. Alternatively, the RFID reader 140 may send a signal to a power supply 142 for the power supply 142 to transmit a certain power to the antennae 130a, 130b. The power sent to the antennae 130a, 130b is one factor that the RFID reader 140 can use to determine the optimal electromagnetic field to generate. For example, for a smaller bin 160, the RFID reader 140 can select a smaller amount of power to create a smaller electromagnetic field, while for a larger bin 160, a larger amount of power.

In another example, the RFID reader 140 may select a higher power if a higher read rate or accuracy is desired. For example, if a larger number of tags interrogated within a period of time is desired, then the RFID reader 140 may select a high amount of power. Also, if a lower read accuracy (percentage of tags read successfully) is allowed, then the RFID reader 140 may select a lower amount of power.

The RFID reader 140 may transmit at a particular frequency or have the option to transmit at different frequencies. For example, the RFID reader 140 transmits at low frequency bands from 30 kHz to 300 kHz. These frequency ranges can be useful for small bins as this frequency range provides short read ranges and is generally less sensitive to radio wave interference. The RFID reader 140 may also transmit at an ultra high frequency (UHF) range, from 3 MHz to 30 MHz, or at even higher frequency ranges from 300 MHz to 3 GHz. For example, in North America, UHF RFID systems generally operate in the frequency range from 902 MHz to 928 MHz, and in Europe, UHF RFID systems generally operate in the frequency range from 865 MHz to 868 MHz. The read range of an ultra high frequency RFID reader 140 can reach several yards and have faster data transfer.

The RFID tags 164a, 164b can be attached to the items 162a, 162b as shown in FIG. 2. These RFID tags 164a, 164b may include an integrated circuit that is connected to an antenna. The integrated circuit can be disposed on a low-conductive material on the RFID tags 164a, 164b. The RFID tags 164a, 164b also may include a memory that stores data about the product, such as the product code. For example, the RFID tags 164a, 164b may store 1024 bytes of information.

The RFID tags 164a, 164b may be passive RFID tags that include a transponder. The transponder can convert the electromagnetic field into usable power, and use the power to transmit data. The RFID tags 164a, 164b may be pre-programmed to transmit a particular set of data. The RFID interrogation unit 120 may also be able to receive signals from active RFID tags, which may function as transponders that send a signal in response to the RF interrogation field generated by the RFID unit.

Example Antenna Cable for RFID Interrogation Unit

The antennae 130a, 130b may each comprise an antenna 250 that can generate an electromagnetic field. In the example of FIG. 2C, the antenna comprises a connector 260, an active length 270, and a ferrite core 280. However, the antenna can comprise a non-active length and/or an antenna comprising an active length 270 without a ferrite core 280.

In one embodiment, the antenna 250 can be a traveling wave antenna such that the RF waves travel along the antenna 250 in one direction toward a ferrite core 280. The energy of the traveling wave can be absorbed by the ferrite core 280. Other antennas may be used, such as a resonant antenna (e.g. monopole or dipole) with RF waves traveling in both directions.

The traveling wave antenna may be a standard coax cable. In some implementations, the antenna 250 can comprise an HA-VIS LOCFIELD antenna available from Harting, Inc. of North America (Elgin, Ill.). The antenna 250 may be sufficiently flexible to be formed into the shapes shown in FIG. 2C.

The antenna 250 can generate a localized electromagnetic field 290 along the contour of the active length 270. For example, the electromagnetic field 290 may encircle the length of the antenna 250 creating a tube or cylinder-like shape. The electromagnetic field 290 may have substantially the same diameter throughout the cable or may change. For example, the diameters of the electromagnetic field 290 can be reduced as the traveling wave travels through the antenna 250, to become a funnel shape. The diameter of the electromagnetic field 290 can be adjusted by changing the RF power supplied by the RFID reader 140.

The antenna 250 can be different lengths and diameters. For example, the antenna 250 may be 1 meter, 2 meters, or 0.3 meters long, and/or 3 mm, 5 mm, or 7 mm in diameter. The connector 260 may comprise a subminiature version A (SMA) connector or other connectors to connect the antenna 250 to the RFID reader 140.

The antenna 250 may be configured to be polarized differently. For example, the antenna 250 can be linear or circular polarized. A circular polarized antenna may generally have better performance with reading an RFID tag in different orientations. Linear polarized antennas may generally have better read ratings.

Example Radiation Pattern

Figure 3B:
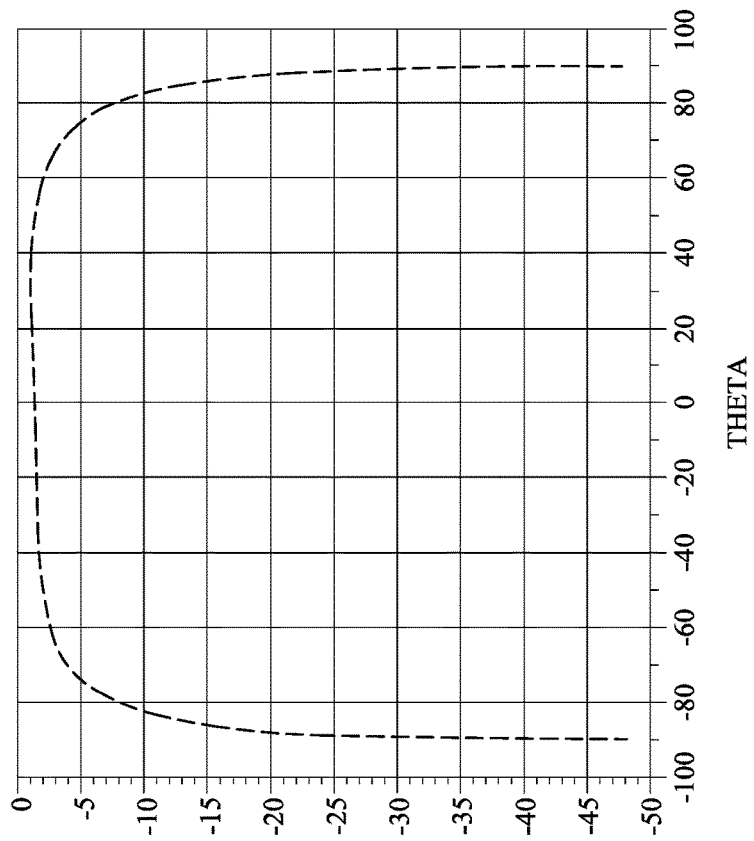

FIG. 3A illustrates an example of an antenna shape of the inventory management system 100 including an RFID reader 140, an antenna 130a, and a ferrite core 132a. FIG. 3B illustrates an example of a radiation pattern of the antenna shape of FIG. 3A.

The radiation pattern illustrates the total electromagnetic field pattern. To increase the radiation pattern while maintaining the same or substantially the same shape, the RFID reader 140 can send more power to the antenna 130a. The radiation pattern can fit the area of a bin 160 while maintaining a level of read rate and/or accuracy.

FIG. 3B-1 is an example 2D polar plot and planar plot in the XZ plane of the RF radiation pattern generated by the RFID interrogation unit. FIG. 3B-1 is an example 2D polar plot and planar plot of the radiation pattern in the YZ plane. FIGS. 3B-1 and 3B-2 used the antenna pattern of FIG. 3A. In these examples, the XY plane is horizontal and the Z-axis is vertical. The plots in FIG. 3B-2 are in a plane rotated 90 degrees around the Z plane relative to the plots of FIG. 3B-1. The plots in FIGS. 3B-1 and 3B-2 show that the RF field generated by the RFID interrogation unit can be substantially symmetric about the vertical (Z) axis and can substantially fill a region above the RFID unit (where RFID tagged items can be placed).

Figure 3C:
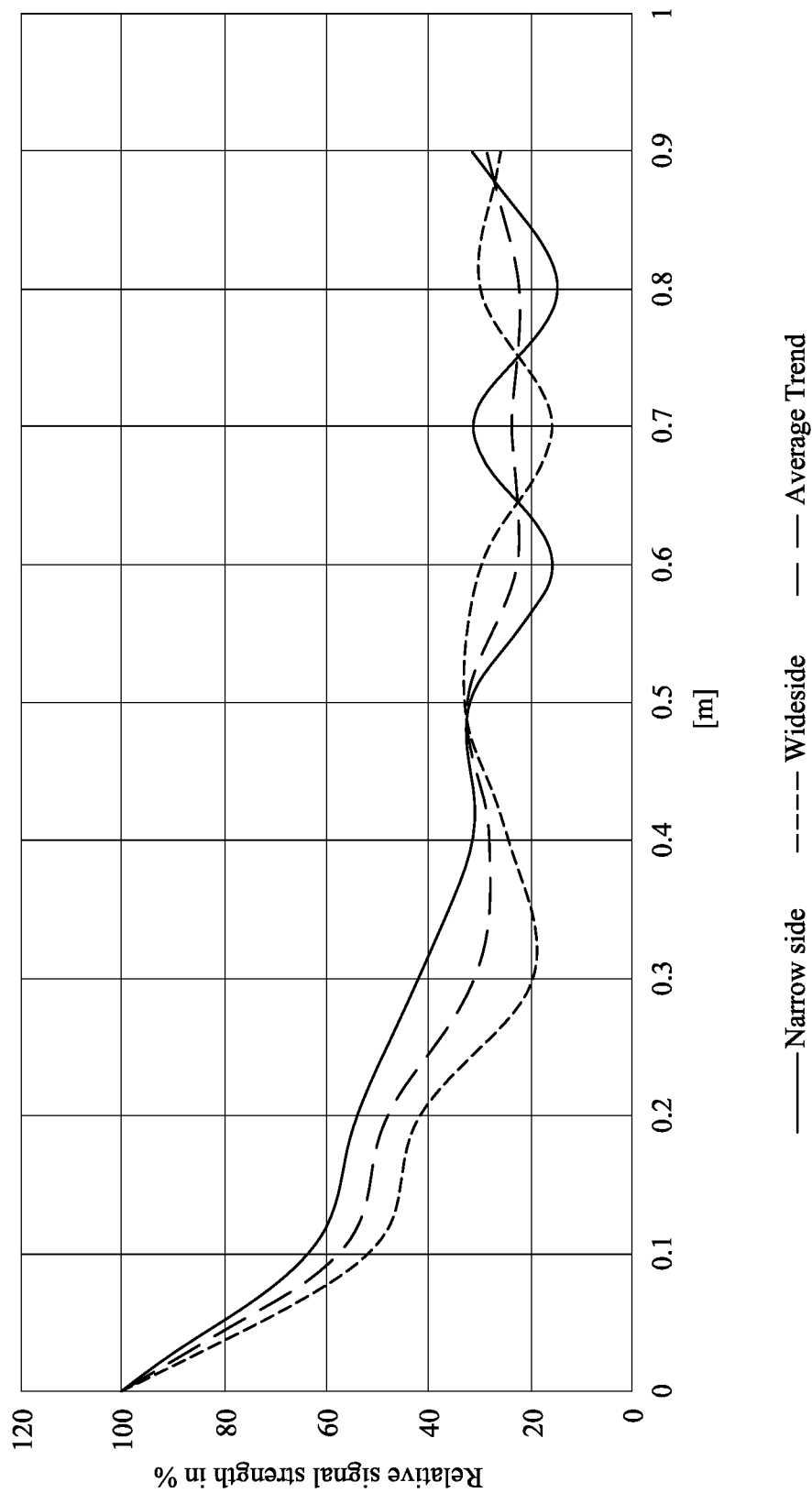
FIG. 3C illustrates an example of relative received power for the antenna shape of FIG. 3A at particular distances from the RFID interrogation unit.

FIG. 3C illustrates relative received power (from tags interrogated with the RF field shown in FIGS. 3B-1 and 3B-2) at the RFID reader at a range of distances above the RFID interrogation unit. The RFID interrogation unit was assumed to be rectangular with horizontal size 62 cm by 52 cm. The solid curve is for the narrow side in the X direction, and the dashed curve is for the wide side in the Y direction. The long-dashed curve shows the average trend of the wide and narrow sides. The results indicated that within 0.2 meters, the average received signal strength remains above 50%, and that beyond 0.6 meters the average received signal strength drops below about 70%. Accordingly, in this example, the RFID interrogation unit has a relatively high probability of being able to interrogate RFID tags within a few tenths of a meter of the unit. This performance can be further improved, such as by using a high-conductive material on the side 126 of the RFID interrogation unit 120, RF signal conditioning, additional antennae, and/or higher power levels delivered to the antenna.

For the radiation pattern in FIGS. 3B-1, 3B-2, and 3C, the antenna parameters were:

| | |
|---|---|
| Power Radiated (Watts) | 0.120244 |
| Effective Angle (Steradians) | 4.14752 |
| Directivity (dB) | 4.81422 |
| Gain (dB) | −4.378517 |
| Maximum Intensity (Watts/Steradian) | 0.0289917 |
| Angle of U Max (theta, phi) | 18, 108 |
| E(theta) max (mag, phase) | 1.98231, 39.0343 |
| E(phi) max (mag, phase) | 4.23256, −105.123 |
| E(x) max (mag, phase) | 3.56948, 80.3616 |
| E(y) max (mag, phase) | 2.95426, 54.0596 |
| E(z) max (mag, phase) | 0.612569, −140.966 |

Example Scalable Antenna Shape

Figure 4:
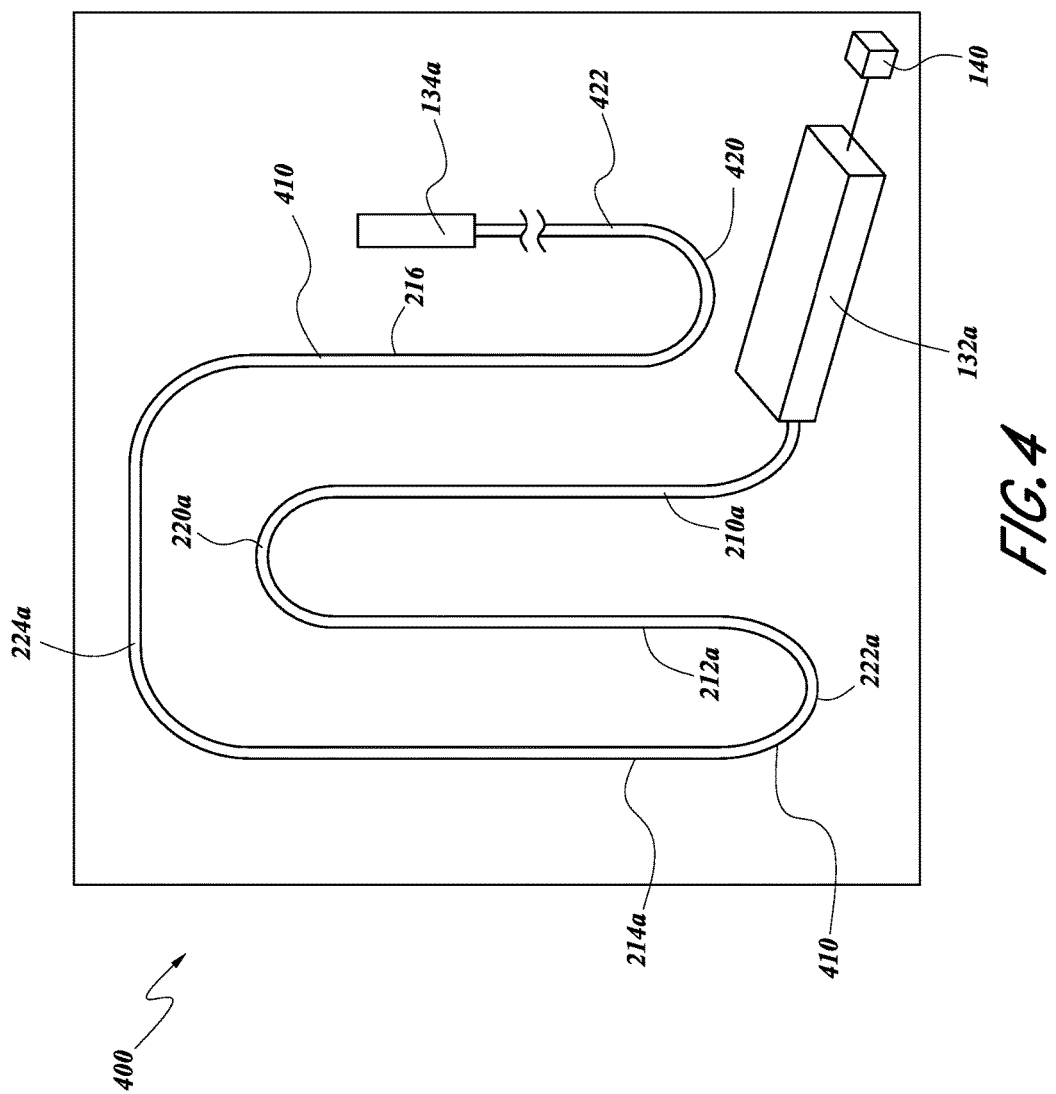
FIG. 4 illustrates an example of a scalable antenna shape of the inventory management system.

Multiple antennae and/or different lengths of antennae can be used. FIG. 4 illustrates an example of a scalable antenna shape of the inventory management system 100. The antenna 410 can have similar characteristics of antenna 130a. In this example, the antenna 410 connects to the RFID reader 140, extends on a first arm 210a, connects to a first bend 220a, extends on a second arm 212a, connects to a second bend 222a, extends on a third arm 214a, connects to a third bend 224a, and extends on a fourth arm 216a.

The antenna 410 connects to a fourth bend 420 and extends on a fifth arm 422. The antenna 410 can connect and extend to a plurality of bends and arms. The antenna 410 can connect to a ferrite core 132a. The plurality of bends and arms can be determined based on the radiation field desired, the bin size, and/or unwanted reads (e.g. nearby bins).

Furthermore, a different combination of configurations can be used. FIG. 5A illustrates an example of an antenna shape of the inventory management system including four antennae 510, 520, 530, and 540. The antennae 510, 520 each connect to the RFID reader 140, extend on a first arm, connect to a first bend, extend on a second arm, and connect to a ferrite core. The antennae 530, 540 each connect to the RFID reader 140, extend on a first arm, connect to a turn, extend on a second arm, connect to a second bend, extend on a third arm, and connect to a ferrite core.

Figure 5B:
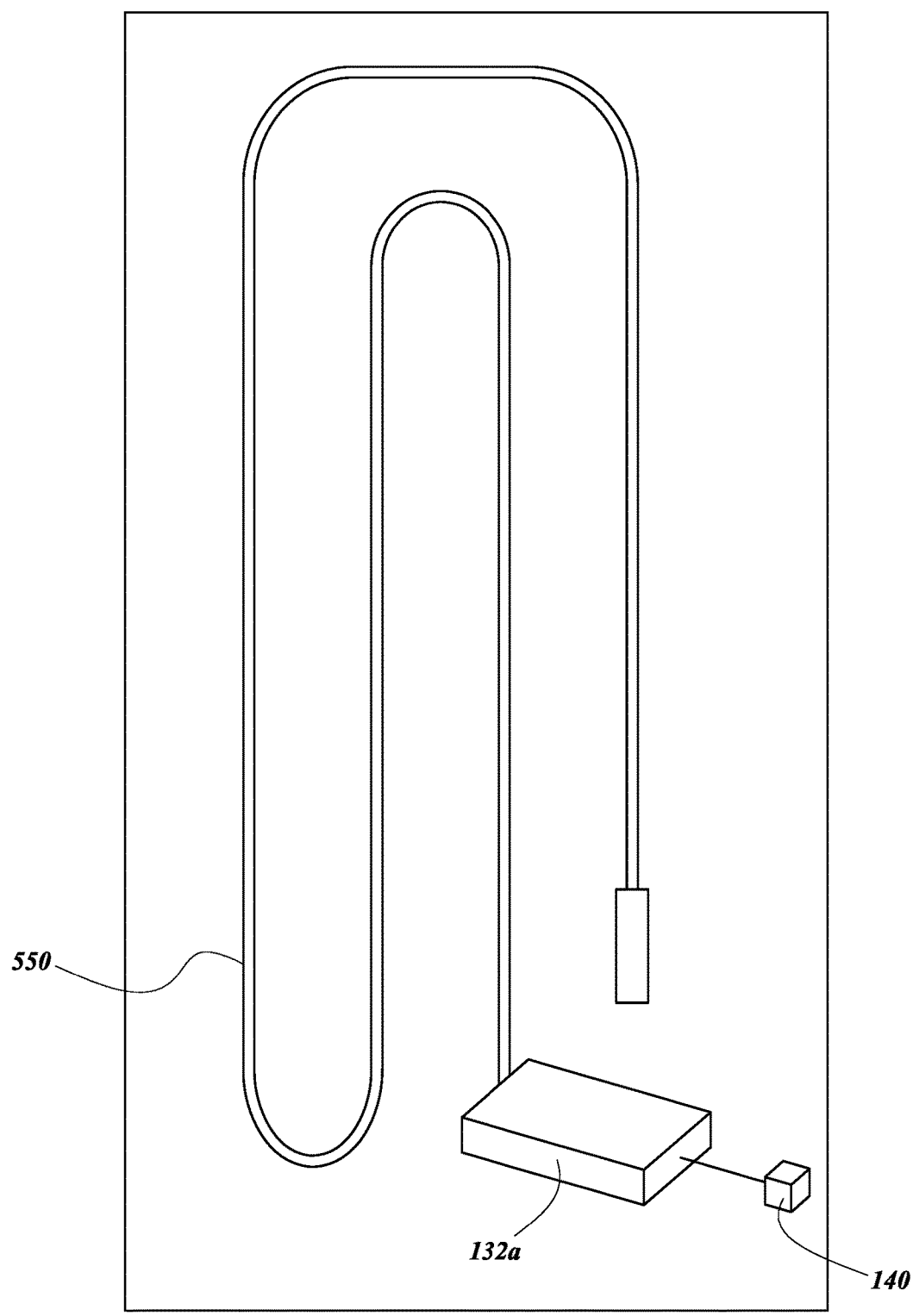
FIG. 5B illustrates an example of an antenna shape of the inventory management system including a single antenna with longer arms.

FIG. 5B illustrates an example of an antenna shape of the inventory management system including a single antenna with three bends. In this example, the antenna 550 connects to the RFID reader 140, to a ferrite core 132a, extends on a first arm, connects to a first bend, extends on a second arm, connects to a second bend, extends on a third arm, connects to a third bend, extends on a fourth arm, and connects to a terminal end 134a. The length L of the first, second, third, and/or fourth arm is shown to be longer than the lengths L1, L2, L3, L4 of antenna 130a of FIG. 2A. However, the length L can be different for each arm, and/or can be shorter than the antenna 130a.

FIG. 5C illustrates an example of an antenna shape of the inventory management system including a single antenna with several bends. The antenna 560 is a single antenna creating the antenna shape from the RFID reader 140 to a terminal end 134a. Each arm can be at a distance from at least one other arm by substantially lambda/4 (e.g. quarter wavelength), as described above.

Figure 5D:
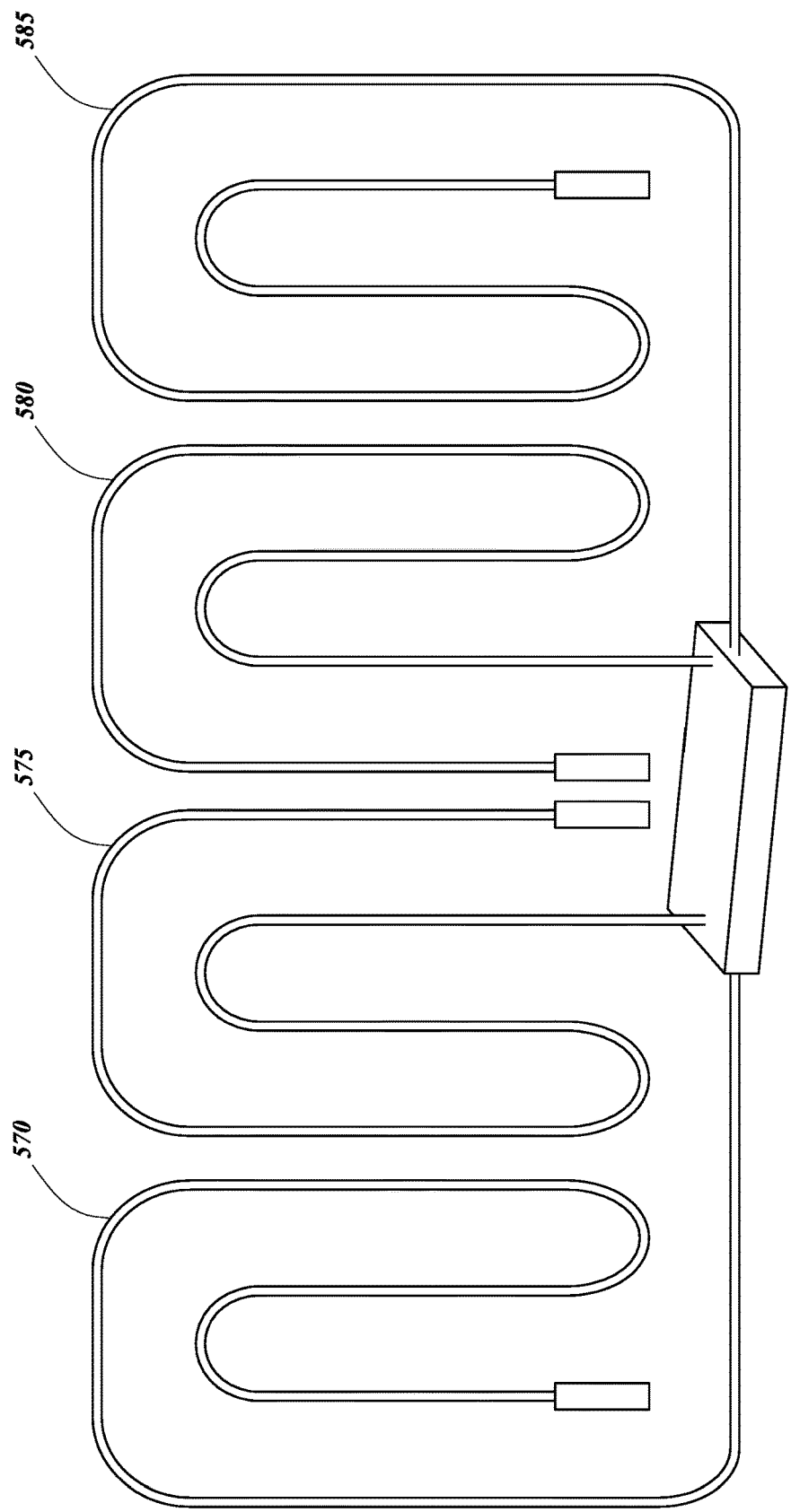
FIG. 5D illustrates an example of an antenna shape of the inventory management system including four antennas.

FIG. 5D illustrates an example of an antenna shape of the inventory management system including four antennae 570, 575, 580, 585. Each of the antennae 570, 575, 580, 585 includes a series of arms and bends, one bend within the circumference of another bend. The antennae 570, 575, 580, 585 may have similar characteristics of antennae 130a, 130b, but may also be different. Therefore in this example, the RFID reader 140 is connected to four antennae 570, 575, 580, 585. However, a different number of antennae, antennae of different shapes, sizes, lengths, widths, bend radiuses, and other characteristics of antennae can be used.

Example Method for Interrogating Items in a Bin

Figure 6:
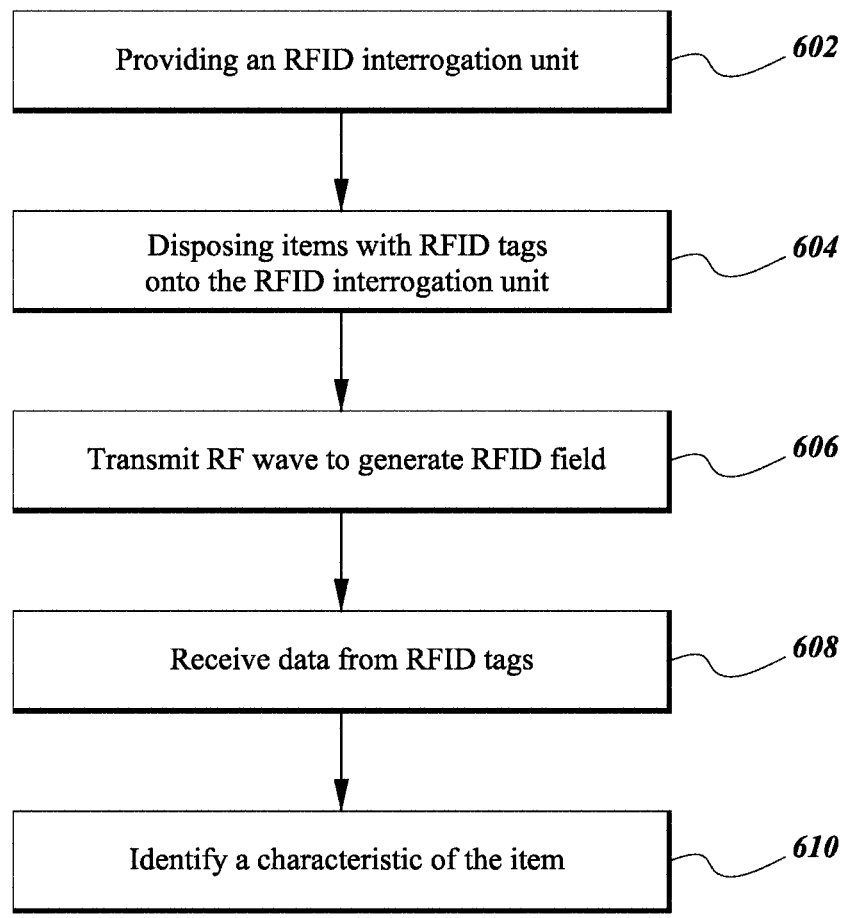
FIG. 6 is a flowchart that illustrates an example of a method for identifying items in a bin including an RFID interrogation unit of the inventory management system.

FIG. 6 is a flowchart that illustrates an example of a method for interrogating items in a bin including an RFID interrogation unit of the inventory management system. At block 602, an RFID interrogation unit is provided. The RFID interrogation unit can include an antenna disposed on a low-conductive material. The antenna may be configured to transmit an RF wave at a wavelength. In this example, the antenna includes a specific antenna shape. The antenna comprises a first arm connected to a second arm by a first bend, the first arm at a distance D1 from the second arm, D1 being substantially a quarter wavelength. A high-conductive material may also be provided. The high-conductive material may be disposed at a height H from the antenna, the height substantially a quarter wavelength.

At block 604, a bin with items is disposed over the RFID interrogation unit. RFID tags may be attached to the items and/or the bin, or may otherwise be placed in the bin. RFID tags may be placed onto the RFID interrogation unit without the bin and/or the items.

At block 606, an RF wave is transmitted to generate an RFID field that interrogates the RFID tags. The RF wave comprises a signal at a wavelength. The RF wave that generates the RFID field activates the RFID tags by collecting power. The RFID tags transmit data back to the antenna.

At block 608, the data is received from the RFID tags. The data may comprise or be associated with a product code. For example, the data includes at least one of: a universal product code (UPC), an international article code (EAN), an international standard book number (ISBN), or an Amazon standard identification number (ASIN). The data may also include a product description and/or a quantity.

At block 610, a characteristic of the item is identified. For example, if an ASIN code is obtained, a name of the item and the quantity of the item may be identified.

Additional Information

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or as a combination of electronic hardware and executable software. To clearly illustrate this interchangeability, various illustrative components, blocks, modules, and steps have been described above generally in terms of their functionality. Whether such functionality is implemented as hardware, or as software that runs on hardware, depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a directed stowage computing device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A directed stowage computing device can be or include a microprocessor, but in the alternative, the directed stowage computing device can be or include a controller, microcontroller, or state machine, combinations of the same, or the like configured to receive and process image data. A directed stowage computing device can include electrical circuitry configured to process computer-executable instructions. Although described herein primarily with respect to digital technology, a directed stowage computing device may also include primarily analog components. For example, some or all of the directed stowage algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a directed stowage computing device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the directed stowage computing device such that the directed stowage computing device can read information from, and write information to, the storage medium. In the alternative, the storage medium can be integral to the directed stowage computing device. The directed stowage computing device and the storage medium can reside in an ASIC. The ASIC can reside in a user terminal. In the alternative, the directed stowage computing device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" or "the" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

As used herein, the terms "determine" or "determining" encompass a wide variety of actions. For example, "determining" may include calculating, computing, processing, deriving, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing, and the like.

As used herein, the term "selectively" or "selective" may encompass a wide variety of actions. For example, a "selective" process may include determining one option from multiple options. A "selective" process may include one or more of: dynamically determined inputs, preconfigured inputs, or user-initiated inputs for making the determination. In some implementations, an n-input switch may be included to provide selective functionality where n is the number of inputs used to make the selection.

As used herein, the terms "provide" or "providing" encompass a wide variety of actions. For example, "providing" may include storing a value in a location for subsequent retrieval, transmitting a value directly to the recipient, transmitting or storing a reference to a value, and the like. "Providing" may also include encoding, decoding, encrypting, decrypting, validating, verifying, and the like.

As used herein, the term "message" encompasses a wide variety of formats for communicating (e.g., transmitting or receiving) information. A message may include a machine readable aggregation of information such as an XML, document, fixed field message, comma separated message, or the like. A message may, in some implementations, include a signal utilized to transmit one or more representations of the information. While recited in the singular, it will be understood that a message may be composed, transmitted, stored, received, etc. in multiple parts.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

What is claimed is:

1. An inventory control system comprising:
a mobile cart configured to receive a bin that includes items tagged with radio frequency identification (RFID) tags, the RFID tags configured to transmit data associated with the items;
an RFID interrogation unit comprising:
a low-conductive material disposed on a top surface of the mobile cart;
a first antenna disposed on the low-conductive material, the first antenna configured to transmit a radio frequency ("RF") wave at a wavelength, wherein the first antenna comprises:
a first arm connected to a second arm by a first bend, the first arm at a first distance from the second arm, the first distance being substantially one quarter of the wavelength to within a lateral displacement of less than 20%; and
a third arm connected to the second arm by a second bend, the second arm at a second distance from the third arm, the second distance being substantially one quarter of the wavelength to within a lateral displacement of less than 20%; and
a high-conductive material disposed on one or more sides of the mobile cart at a height from the first antenna, the height being substantially one quarter of the wavelength to within a lateral displacement of less than 20%;
an RFID reader electrically coupled to the first antenna, and configured to:
transmit the RF wave to the first antenna to generate an RFID field capable of interrogating the RFID tags;
receive RFID data from the RFID tags; and
identify a number of the items or determine an identifier for the items in the bin based on the RFID data; and
a power source coupled to the RFID reader.

2. The inventory control system of claim 1, wherein the first antenna further comprises a fourth arm connected to the third arm by a third bend, the fourth arm at a third distance from the first arm, the third distance being substantially one quarter of the wavelength to within a lateral displacement of less than 20%.

3. The inventory control system of claim 1, wherein the RFID interrogation unit further comprises a second antenna disposed on the low-conductive material, the second antenna comprising:
a first arm connected to a second arm by a first bend, the first arm at a fourth distance from the second arm, the fourth distance being substantially one quarter of the wavelength to within a lateral displacement of less than 20%; and
a second bend connecting the second arm to a third arm, the second arm at a fifth distance from the third arm, the fifth distance being substantially one quarter of the wavelength to within a lateral displacement of less than 20%;
a fourth arm connected to the third arm by a third bend, the fourth arm at a sixth distance from the first arm, the sixth distance being substantially one quarter of the wavelength to within a lateral displacement of less than 20%.

4. The inventory control system of claim 2, wherein the first bend is within a circumference of the third bend.

5. An inventory control method comprising:
providing a radio frequency identification (RFID) interrogation unit comprising:
a first antenna disposed on a low-conductive material that forms a horizontal surface, the first antenna configured to transmit a radio frequency (RF) wave at a wavelength, wherein the first antenna comprises:
a first arm connected to a second arm by a first bend, the first arm at a first distance from the second arm, the first distance being substantially one quarter of the wavelength to within a lateral displacement of less than 20%; and
a second bend connecting the second arm to a third arm, the second arm at a second distance from the third arm, the second distance being substantially one quarter of the wavelength to within a lateral displacement of less than 20%; and
a high-conductive material disposed at a height from the horizontal surface, the height being substantially one quarter of the wavelength to within a lateral displacement of less than 20%;
disposing an item tagged with a radio frequency identification (RFID) tag on or adjacent the RFID interrogation unit;
transmitting the RF wave at the wavelength to generate an RFID field configured to interrogate the RFID tag; and
receiving a return signal from the RFID tag.

6. The inventory control method of claim 5, wherein the first antenna further comprises a fourth arm connected to the third arm by a third bend, the fourth arm at a third distance from the first arm, the third distance being substantially one quarter of the wavelength to within a lateral displacement of less than 20%.

7. The inventory control method of claim 5, further comprising providing a second antenna, the second antenna comprising:
a first arm connected to a second arm by a first bend, the first arm at a fourth distance from the second arm, the fourth distance being substantially one quarter of the wavelength to within a lateral displacement of less than 20%; and
a third arm connected to the second arm by a second bend, the second arm at a fifth distance from the third arm, the fifth distance being substantially one quarter of the wavelength to within a lateral displacement of less than 20%;
a fourth arm connected to the third arm by a third bend, the fourth arm at a sixth distance from the first arm, the sixth distance being substantially one quarter of the wavelength to within a lateral displacement of less than 20%.

8. The inventory control method of claim 6, wherein the first bend is within a circumference of the third bend.

9. The inventory control method of claim 6, further comprising:
identifying a characteristic of the item by analyzing the return signal from the RFID tag.

10. A radio frequency identification (RFID) interrogation unit comprising:
an electrically low-conductive top surface;
an antenna disposed in or on the electrically low-conductive top surface, the antenna configured to transmit a radio frequency (RF) wave having a wavelength, the antenna comprising:
a first arm connected to a second arm by a first bend, the first arm at a first distance from the second arm, the first distance being substantially one quarter of the wavelength to within a lateral displacement of less than 20%;
a third arm connected to the second arm by a second bend, the second arm at a second distance from the third arm, the second distance being substantially one quarter of the wavelength to within a lateral displacement of less than 20%;
a bottom surface comprising an electrically conductive material, the bottom surface spaced a height from the top surface, the height being substantially one quarter of the wavelength to within a lateral displacement of less than 20%;
an RFID reader electrically coupled to the antenna and configured to:
transmit the RF wave to the antenna to generate an RFID interrogation field capable of interrogating RFID tags disposed above the top surface; and
receive, in response to the RF wave, a return electromagnetic signal from the RFID tags.

11. The RFID interrogation unit of claim 10, wherein the antenna comprises a plurality of antennas, each of the plurality of antennas electrically coupled to the RFID reader.

12. The RFID interrogation unit of claim 10, wherein the RFID reader communicates a traveling wave to the antenna.

13. The RFID interrogation unit of claim 10, wherein an end of the antenna opposite the RFID reader comprises a ferrite core.

14. The RFID interrogation unit of claim 13, wherein an energy absorbing material is disposed near the ferrite core.

15. The RFID interrogation unit of claim 10, wherein the RF wave generates a localized electromagnetic field circumferentially oriented along a longitudinal axis of the antenna.

16. The RFID interrogation unit of claim 10, wherein at least one of the first arm or the second arm is substantially straight such that the arm does not extend laterally away from a straight line connecting its ends by more than 20% of its length.

17. The RFID interrogation unit of claim 10, wherein a length of the first arm and a length of the second arm are different lengths.

18. The RFID interrogation unit of claim 10, further comprising a side surface extending from the bottom surface to the top surface, wherein at least a portion of the side surface comprises a high-conductive material.

19. The RFID interrogation unit of claim 10, wherein the RFID reader is configured to identify a characteristic of an item based at least in part on the return electromagnetic signal from the RFID tags.

* * * * *